US008717206B2

(12) United States Patent
Geerlings

(10) Patent No.: US 8,717,206 B2
(45) Date of Patent: May 6, 2014

(54) SHIFT REGISTER, ELECTRONIC DEVICE, CONTROL METHOD AND SOFTWARE PROGRAM PRODUCT

(75) Inventor: Jurgen Geerlings, Valkenswaard (NL)

(73) Assignee: NXP B.V., Eindhoven (NL)

( * ) Notice: Subject to any disclaimer, the term of this patent is extended or adjusted under 35 U.S.C. 154(b) by 319 days.

(21) Appl. No.: 13/278,045

(22) Filed: Oct. 20, 2011

(65) Prior Publication Data

US 2012/0099696 A1    Apr. 26, 2012

(30) Foreign Application Priority Data

Oct. 22, 2010   (EP) .................................... 10188496

(51) Int. Cl.
*H03M 13/27* (2006.01)
*H03M 9/00* (2006.01)
*G11C 19/28* (2006.01)

(52) U.S. Cl.
CPC ................. *H03M 9/00* (2013.01); *G11C 19/28* (2013.01); *H03M 13/27* (2013.01)
USPC .............................................. 341/81; 377/77

(58) Field of Classification Search
CPC .. H03M 9/00; H03M 13/2732; H04L 1/0071; G11C 19/28
USPC ............................... 341/81, 100, 101; 377/77
See application file for complete search history.

(56) References Cited

U.S. PATENT DOCUMENTS

| | | | |
|---|---|---|---|
| 3,652,998 A | 3/1972 | Forney, Jr. | |
| 5,982,309 A * | 11/1999 | Xi et al. | 341/101 |
| 6,150,965 A * | 11/2000 | Carr et al. | 341/101 |
| 6,556,647 B1 | 4/2003 | Neravetla | |
| 7,499,519 B1 | 3/2009 | Hsieh et al. | |
| 7,511,642 B1 * | 3/2009 | Han et al. | 341/81 |
| 2008/0043898 A1 | 2/2008 | Kim | |
| 2010/0074391 A1 | 3/2010 | Rose et al. | |
| 2012/0221882 A1 * | 8/2012 | Morrison et al. | 713/500 |

FOREIGN PATENT DOCUMENTS

| | | |
|---|---|---|
| CN | 101458967 | 6/2009 |
| JP | 59072227 A * | 4/1984 |
| JP | 02 046598 A | 2/1990 |
| JP | 03121626 A * | 5/1991 |

OTHER PUBLICATIONS

Extended Search Report for European Patent Appln. No. 10188496.3 (Feb. 1, 2011).
Counterpart CN Office Action CN201110318568.4 (Feb. 24, 2014).

* cited by examiner

*Primary Examiner* — Howard Williams

(57) ABSTRACT

Disclosed is a shift register (200, 400) comprising an input (205), an output (230) and a plurality of register cells (210) serially connected between the input and the output, each register cell being connected to a neighboring cell via a node, wherein at least some of said nodes comprise a multiplexer (220) having an output coupled to the downstream register cell and a plurality of inputs, each of said plurality of inputs being coupled to a different upstream register cell such that different length sections of the shift register can be selectively bypassed, the shift register further comprising a set of parallel IO channels (230, 410) facilitating conversion between interleaved and de-interleaved data, each of said channels being coupled to a different one of said nodes, the number of parallel IO channels being smaller than the total number of register cells in the shift register.

14 Claims, 4 Drawing Sheets

SHIFT REGISTER, ELECTRONIC DEVICE, CONTROL METHOD AND SOFTWARE PROGRAM PRODUCT

CROSS-REFERENCE TO RELATED APPLICATIONS

This application claims the priority under 35 U.S.C. §119 of European patent application No. 10188496.3, filed on Oct. 22, 2010, the contents of which are incorporated by reference herein.

BACKGROUND OF THE INVENTION

The present invention relates to a shift register comprising an input, an output and a plurality of register cells serially connected between the input and the output, each register cell being connected to a neighboring cell via a node, wherein at least some of said nodes comprise a multiplexer having an output coupled to the downstream register cell and a plurality of inputs.

The present invention further relates to an electronic device comprising such a shift register.

The present invention yet further relates to a method of controlling such a shift register.

The present invention still further relates to a software program product implementing such a control method.

Shift registers have become commonplace in digital electronic circuits. One of the most common uses of shift registers is to provide a serial to parallel or parallel to serial data conversion. For instance, data may be loaded into the shift register in parallel and shifted out of the shift register in a serial fashion, or alternatively, data may be shifted serially into a shift register, after which the data is read out in parallel.

The control of such a shift register can be efficiently implemented onto a controller such as a central processing unit (CPU), e.g. by means of software instructions as long as the data conversion level is maximal. A maximal data conversion level is achieved when the data does not require de-interleaving in case of parallel-to-serial conversion or interleaving in case of serial-to-parallel conversion, i.e. when for N-bit data the conversion is between N parallel channels and a single serial source.

Figure 1:
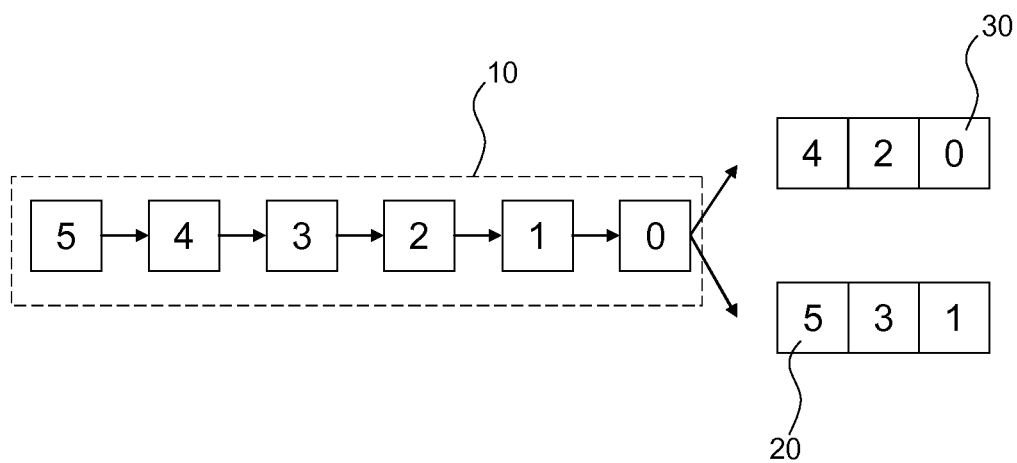

However, in case of (de-)interleaving, such a controller typically requires a relative large number of instructions to implement the required data conversion. FIG. 1 shows an example of an arrangement in which data from serial shift register 10 has to be de-interleaved to two serial lanes 20 and 30, with the data from the odd register cells going to serial lane 20 and the data from the even register cells going to serial lane 30.

The problem is how to efficiently select the even and odd bits using a state of the art controller such as a RISC CPU instruction set. With normal shift register processing, every bit has to be shifted in and loaded separately. Thus for an M-bit word this requires M−1 shift instructions and m store instructions. For example, for M=32 this requires 32 loads+ 31 shifts=63 instructions to de-interleave the parallel data in the shift register 10. In high-speed application domains, the need to execute such a large number of instructions for the serial-to-parallel conversion or vice versa of a data word may cause an unacceptable degradation of the overall performance of the electronic device comprising the shift register.

SUMMARY OF THE INVENTION

The present invention seeks to provide a shift register that can be more efficiently controlled when (de-)interlacing data to or from the shift register.

The present invention further seeks to provide an electronic device comprising such a shift register.

The present invention yet further seeks to provide a method of controlling such a shift register, and a software program product implementing such a method.

According to a first aspect of the present invention, there is provided a shift register comprising an input, an output and a plurality of register cells serially connected between the input and the output, each register cell being connected to a neighboring cell via a node, wherein at least some of said nodes comprise a multiplexer having an output coupled to the downstream register cell and a plurality of inputs, each of said plurality of inputs being coupled to a different upstream register cell such that different length sections of the shift register can be selectively bypassed, the shift register further comprising a set of parallel IO channels facilitating conversion between interleaved and de-interleaved data, each of said channels being coupled to a different one of said nodes, the number of parallel IO channels being smaller than the total number of register cells in the shift register.

This shift register has the advantage that the presence of the plurality of IO channels allows for parallel loading of data into or from the shift register, with the interconnectivity of the multiplexers ensuring that the correct amount of register cells can be bypassed such that the register cells intended to contain bits belonging to the same interleaved data portion can be directly interconnected, such that the bits belonging to the same interleaved data portion can be directly shifted between such register cells, thereby significantly reducing the number of instructions required for serial-to-parallel or parallel-to-serial data conversion using the shift register of the present invention.

In an embodiment, the parallel IO channels comprise a set of parallel outputs coupled to the nodes between the N most downstream register cells, N being a positive integer having a value of at least 1. This embodiment is particularly suited to implement parallel-to-serial data conversion, i.e. de-interleaving, as the number N may be chosen to be equal to the number of interleaved data portions in the shift register. Consequently, in operation, in each shift cycle N bits can be shifted from the N most downstream register cells into the serial channels, with the multiplexers ensuring that for each of the register cells, a bit from N positions upstream is directly loaded into the downstream register cell, thereby ensuring that de-interleaving is implemented inside the shift register by configuration of the shift register shift paths using the multiplexers.

In an alternative embodiment, the parallel IO channels comprise a set of parallel inputs coupled to the nodes between the N most upstream register cells, N being a positive integer having a value of at least 1. This embodiment is particularly suited to implement serial-to-parallel data conversion, i.e. interleaving, as the number N may be chosen to be equal to the number of interleaved data portions in the shift register. Consequently, in operation, in each shift cycle N bits can be shifted in parallel into the N most upstream register cells, with the multiplexers ensuring that for each of the register cells, each loaded bit is subsequently shifted N positions downstream, thereby providing a particularly efficient interleaving architecture.

Preferably, the plurality of inputs of the multiplexer are coupled to the outputs of respective register cells such for each input, $2^{(M-1)}-1$ register cells are bypassed, with M being the input number of an input from said plurality of inputs, M being at least 1. In other words, the register cell to which a particular input of the multiplexer is connected may be defined as a power of two, in which the power of two is to identify the nth upstream register cell to which the particular input is connected, thereby bypassing n−1 register cells between the nth upstream register cell and the multiplexer.

In a preferred embodiment, the number of multiplexer inputs matches the number of parallel IO channels, such that in at least one configuration of the multiplexers all parallel IO channels will be utilized.

At least some of said nodes may further comprise a further multiplexer having a first input coupled to the output of the multiplexer, a second input for receiving load data and an output coupled to the downstream register cell. This further multiplexer may be used to write data to or read data from the whole shift register in a parallel manner.

According to a further aspect of the present invention, there is provided an electronic device comprising the shift register of the present invention and a controller for selecting an input of said respective multiplexers. Such an electronic device is capable of performing data (de-)interlacing at higher rates compared to electronic devices using state of the art shift register implementations.

In the embodiment wherein the parallel IO channels comprise a set of parallel outputs coupled to the nodes between the N most downstream register cells, N being a positive integer having a value of at least 1, the controller is configured to de-interleave the parallel data in the shift register into serial data streams on said respective parallel outputs.

Alternatively, in the embodiment wherein the parallel IO channels comprise a set of parallel inputs coupled to the nodes between the N most upstream register cells, N being a positive integer having a value of at least 1, the controller is configured to parallelize the serial input data in the shift register in an interleaved fashion. Hence, in these embodiments, the controller can control data (de-)interleaving requiring a significantly smaller amount of load and shift instructions compared to a device using a state of the art shift register implementation.

The controller may be a microcontroller such as a finite state machine or a CPU.

In accordance with yet another aspect of the present invention, there is provided a method of controlling the shift register of the present invention, comprising the steps of in a serial shift mode of said shift register, selecting one of the inputs of said multiplexers such that data received on said inputs has bypassed a predefined number of register cells; and in a parallel communication mode, communicating data with said selection of said register cells in parallel over said parallel IO channels. The alteration of the serial shift mode and the parallel communication mode facilitates data (de-) interleaving at significantly higher data rates than previously available when using shift registers for such (de-)interleaving.

In an embodiment, the parallel IO channels comprise a set of parallel outputs coupled to the nodes between the N most downstream register cells, N being a positive integer having a value of at least 1, and said data communication step comprises de-interleaving the parallel data in the shift register into serial data streams on said respective parallel outputs.

In an alternative embodiment, the parallel IO channels comprise a set of parallel inputs coupled to the nodes between the N most upstream register cells, N being a positive integer having a value of at least 1, and said data communication step comprises parallelizing the serial input data in the shift register in an interleaved fashion.

The method of the present invention may be made available in the form of a software program product for, when executed on the controller of the electronic device of the present invention, implementing the steps of the method of the present invention. Such a software program product may be stored on a computer-readable medium, such as a CD, DVD, USB memory stick, a peripheral storage device, an internet-accessible storage device such as an internet server or database and so on.

BRIEF DESCRIPTION OF THE EMBODIMENTS

Figure 2:
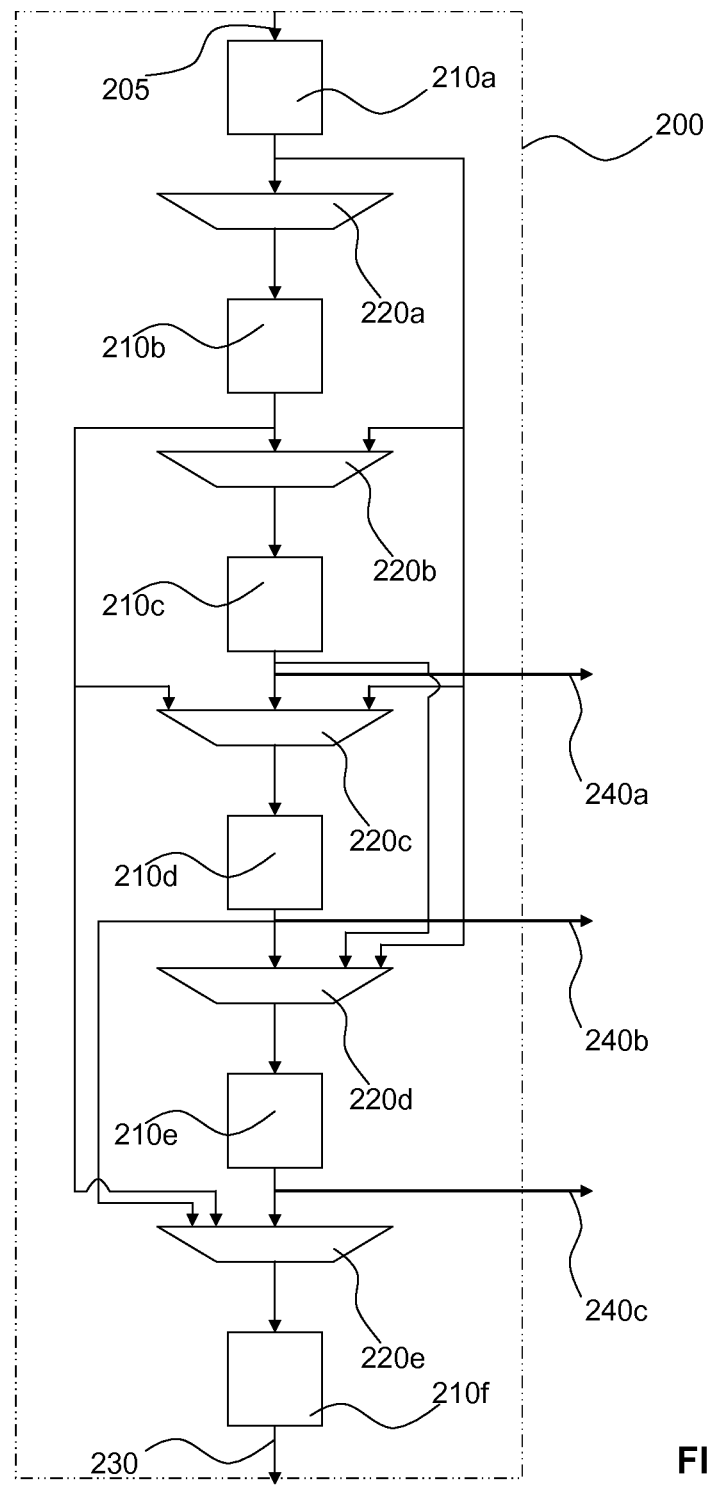
Figure 3:
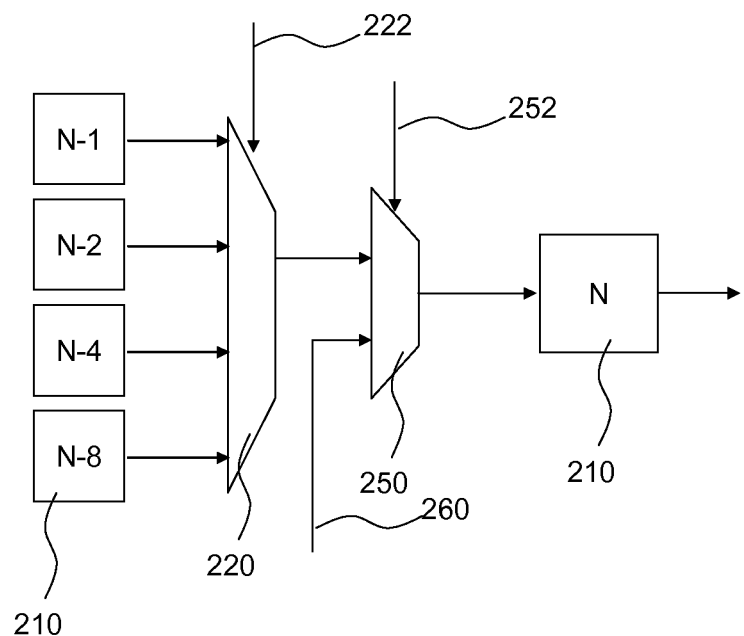
Figure 4:
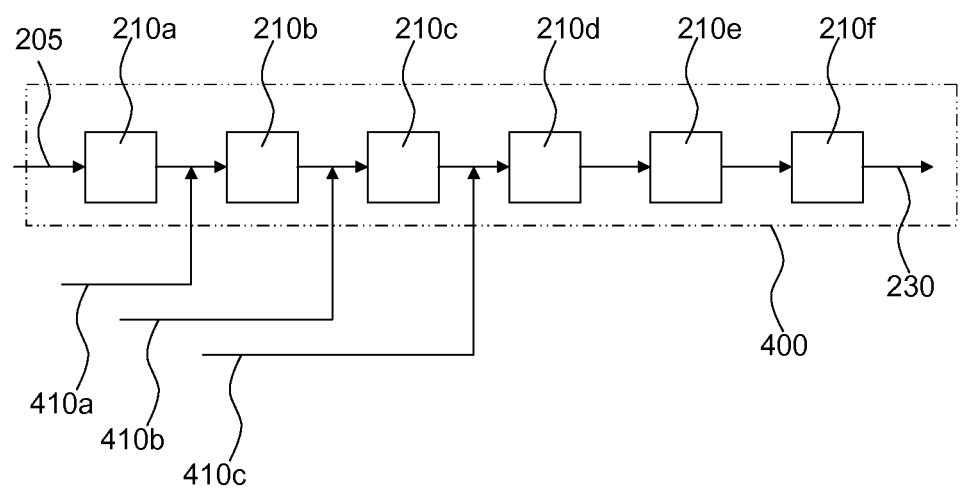
Figure 5:
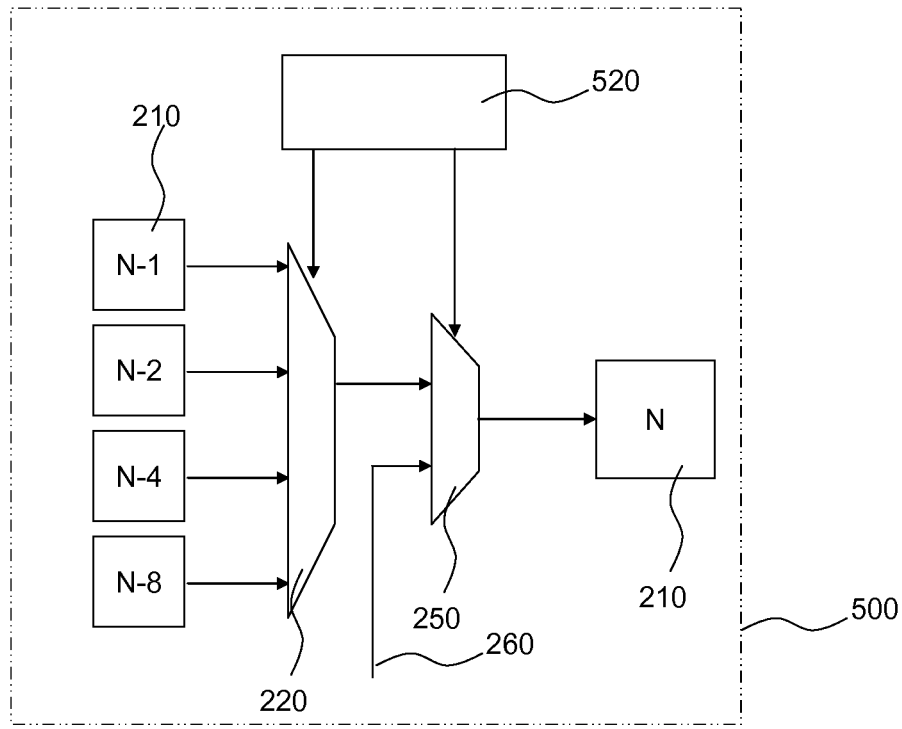
Figure 6:
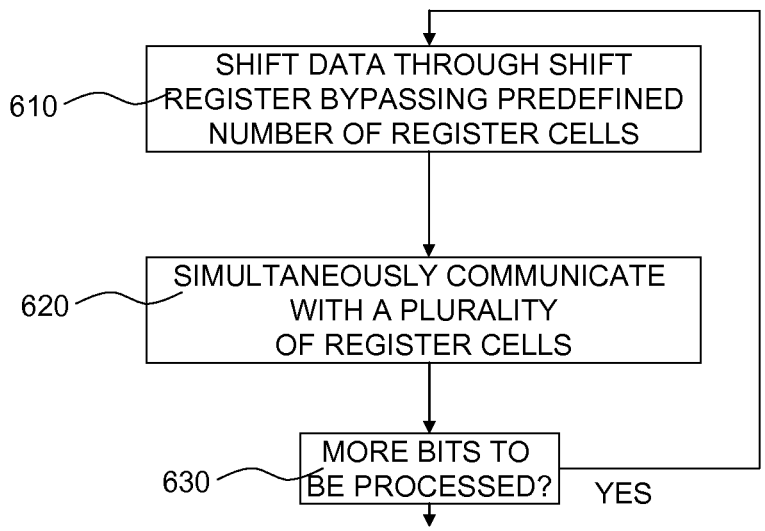

Embodiments of the invention are described in more detail and by way of non-limiting examples with reference to the accompanying drawings, wherein:

FIG. 1 schematically depicts a prior art shift register used for parallel to serial data conversion;

FIG. 2 schematically depicts an embodiment of a shift register of the present invention;

FIG. 3 schematically depicts an aspect of another embodiment of a shift register of the present invention;

FIG. 4 schematically depicts yet another embodiment of a shift register of the present invention;

FIG. 5 schematically depicts an embodiment of an electronic device of the present invention; and FIG. 6 schematically depicts an embodiment of a method of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 2 shows a first embodiment of a shift register 200 in accordance with the present invention. The shift register 200 is particularly suited for a more efficient implementation of parallel-to-serial data conversion, i.e. de-interleaving, wherein an interleaved data word may be loaded in parallel into shift register cells 210a-f in any suitable manner. The connections for such a parallel write operation are not explicitly shown in FIG. 2 for the sake of clarity.

In the context of the present invention, data is considered to stream from the shift register input 205 towards the shift register output 230, wherein for each pair of shift register cells 210 the shift register cell closer to the input 205 being considered the upstream shift register cell and the shift register cell 210 closer to the output 230 considered the downstream shift register cell.

The shift register 200 comprises a plurality of shift register cells 210 that are connected to each other via respective nodes. Each node comprises a multiplexer 220. In FIG. 2, six cells labeled 210a-f and five multiplexers labeled 220a-e are shown by way of non-limiting example only; the skilled person will understand that any suitable number of shift register cells and multiplexers may be used. The multiplexers 220 are used to configurably connect each downstream shift register cell 210 to a plurality of different upstream shift register cells, such that during serial shift mode, a selected number of shift register cells 210 may be bypassed when shifting data from an upstream shift register cell 210 to a downstream shift register cell 210. For instance, multiplexer 220e has inputs for receiving an output from shift register cell 210e, 210d and 210b, such that shift register cell 210f can be configured to receive bits that have bypassed 0, 1 and 3 shift register cells respectively.

In addition, the shift register 200 comprises a plurality of IO channels 240 that are connected to a selection of the nodes, and that are in addition to shift register input 205 and shift register output 230. In FIG. 2, the IO channels are output channels. Typically, in case of the IO channels 240 being outputs, the N channels will be connected to the N most downstream nodes of the shift register 200. Alternatively, in case of the of the IO channels being inputs, the N channels will be connected to the N most upstream nodes of the shift register 200.

The combination of the ability to bypass a selected number of shift register cells 210 during shift mode and the ability to output a plurality of bits during capture mode on output 230 and additional outputs 240a-c as shown in FIG. 2 facilitates an efficient implementation of de-interlacing a data word stored in the shift register 200. This is demonstrated by the following example. In case of a 32-bit shift register 200, i.e. a shift register 200 having 32 shift register cells $210_0$-$210_{31}$, a data word having a bit pattern as shown below may be stored in the shift register 200.

$A_0B_1C_2D_3A_4B_5C_6D_7A_8B_9C_{10}D_{11}A_{12}B_{13}C_{14}D_{15}A_{16}B_{17}C_{18}D_{19}A_{20}B_{21}C_{22}D_{23}A_{24}B_{25}C_{26}D_{27}A_{28}B_{29}C_{30}D_{31}$

The data word comprises four interlaced portions AAAAAAAA, BBBBBBBB, CCCCCCCC and DDDDDDDD. The subscripts indicate in which shift register cell 210 each bit is stored. The multiplexers 200 may be configured using a single instruction only to bypass 3 shift register cells in the shift mode of the shift register cell 210 such that for instance bit A in shift register cell $210_8$ is shifted into shift register cell $210_4$, bit A in shift register cell $210_4$ is shifted into shift register cell $210_8$ and so on. During capture mode, the shift register cells $210_{28-31}$ produce on output channels 240 and output 230 respectively the bit pattern ABCD, such that during each capture cycle these outputs, which may be considered serial lanes, produce a single bit of the de-interlaced data portions forming the data word. Hence, it will be apparent that the complete de-interlacing of the data word may be achieved with only 8 load instructions and 7 shift instructions as opposed to 32 load and 31 shift instructions that would have been required when the arrangement of FIG. 1 would have been used.

It should be understood that the shift register 200 may be implemented in any suitable manner. For instance, the implementation of the shift register cells 210 and the multiplexers 220 is not essential to the present invention; any suitable design may be used. It should also be apparent that not all nodes require the presence of a multiplexer 220; for instance, the multiplexer 220 may be omitted from the node between the two most upstream shift register cells 210 as there may be no need to bypass the most upstream shift register cell 210. Other design optimizations will be apparent to the skilled person.

FIG. 3 depicts an aspect of an alternative embodiment of the shift register 200 of the present invention, in which each node comprises an additional multiplexer 250 placed between the output of the multiplexer 220 and the input of the shift register cell $210_N$. The multiplexer 220 in this non-limiting example has four inputs, i.e. inputs for receiving the output of shift register cells $210_{N-1}$ (bypassing 0 shift register cells), $210_{N-2}$ (bypassing 1 upstream shift register cell), $210_{N-4}$ (bypassing 3 upstream shift register cells) and $210_{N-8}$ (bypassing 7 upstream shift register cells). The multiplexer 250 has two inputs; a first input for connecting the output of the multiplexer 220 to the shift register cell $210_N$ and a second input for writing a data word into the shift register 200 via parallel inputs 260 in a parallel write mode of the shift register 200. The multiplexer 220 and the further multiplexer 250 are controlled by respective control signals 222 and 252, which will be explained in more detail later.

FIG. 4 shows an embodiment of a shift register 400 of the present invention which is particularly suitable for interlacing a data word, i.e. for serial-to-parallel conversion. In FIG. 4, the multiplexers 220 have been omitted for the sake of clarity, but do nevertheless form part of this embodiment. To this end, the shift register 400 comprises a plurality of N serial inputs that are respectively connected to the N most upstream nodes of the shift register 400. The operation of the shift register 400 will be explained by way of a non-limiting example, in which four data portions AAAAAAAA, BBBBBBBB, CCCCCCCC and DDDDDDDD are to be received on input 205 and respective input channels 410a-c. The multiplexers 220 (not shown in FIG. 4) are configured such that during shift mode, 3 shift register cells 210 are bypassed, such that for a 32-bit shift register, the complete interlacing of these four data portions can be achieved by 8 capture instructions and 7 shift instructions. The shift register 400 may further comprise a set of parallel outputs each connected to the output of one of the shift register cells 210 such that the interlaced data word may be read out in parallel. As this is a routine feature of a shift register, this has not been explicitly shown in FIG. 4 for the sake of clarity.

At this stage, it should be appreciated that the sum of the number of output channels 240 and the output 230 in FIG. 2, or the sum of the number of input channels 410 and the input 205 in FIG. 4 should ideally match the maximum interlacing degree of the data word to be stored in the shift register 200 or 400. It should further be understood that it is of course not necessary to always use all IO channels for a (de-)interlacing operation; for instance, taking the non-limiting example embodiment shown in FIG. 4, it is equally possible to use this embodiment to interlace a data word having an interlacing degree of two (i.e. a data word ABABABABAB . . . ) using input 205 and IO channel 410a only.

Similarly, the number of inputs for each multiplexer 220 may be chosen to match the different number of (de-)interlacing degrees to be handled by the shift register 200 or 400. For instance, for a shift register 200 that may be used as:

- a simple shift register for a non-interlaced data word AAAA . . . ,
- a shift register for an interlaced data word of type ABABAB . . . ,
- a shift register for an interlaced data word of type ABCDABCD . . . ,
- a shift register for an interlaced data word of type ABCDEFGHABCDEFGH . . . , each multiplexer 220 requires four inputs to connect the downstream shift register cell $210_N$ to shift register cells $210_{N-1}$, $210_{N-2}$, $210_{N-4}$ and $210_{N-8}$ as shown in FIG. 3.

FIG. 5 shows an embodiment of an electronic device 500 of the present invention. The electronic device 500 comprises a shift register according to one of the embodiments of the present invention, here depicted by the aspect of the shift register embodiment shown in FIG. 3, and a controller 520, which may be a CPU. The CPU 520 is configured to control the multiplexers 220 and 250 such that the shift register 200 can be operated between a parallel capture mode via inputs 260 and a special shift mode in which the multiplexers 220 are configured by the CPU 520 to bypass the appropriate number of upstream shift register cells 210 as previously explained. To this end, the CPU 520 may receive an instruction or some other form of information indicating the (de-)interlacing degree of the data to be communicated with the shift register, and configures the multiplexers 220 accordingly. Due to the combination of the presence of the multiplexers 220 and the IO channels 230 (or 410), the CPU 520 can implement a (de-)interlacing operation with a reduced number of instructions compared to the state of the art arrangement as shown in FIG. 1, which means that higher operation speeds can be achieved with the electronic device 500 of the present invention.

In a preferred alternative embodiment, the controller 520 comprises a CPU for parallel loading data into a reading data from the shift register 200 or 400, and a finite state machine (FSM) for operating the shift and capture operations of the shift register 200 and 400. Consequently, a dedicated FSM clock signal may be used, which has the advantage that a high quality clock signal can be generated. For instance, a clock signal provided to a CPU is typically sensitive to jitter due to the large variations in operational states of the CPU; a FSM clock tends to be much less sensitive to jitter such that higher operating speeds for the operation of the shift register 200 or 400 may be achieved.

The operational principle of the present invention, i.e. the inventive method of controlling the shift register of the present invention is schematically shown in FIG. 6. In step 610, the data is shifted through the shift register 200 or 400 by bypassing a predefined number of shift register cells 210, said number being predefined to match the interlacing distance between bits of the same data portion. In step 620, IO channels 230 or 410 are used to simultaneously capture a plurality of bits into or from the shift register. In step 630 it is ensured that steps 610 and 620 are repeated until all bits have been shifted into or from the shift register.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A shift register comprising an input, an output and a plurality of register cells serially connected between the input and the output, each register cell being connected to a neighboring cell via a node, wherein at least some of said nodes comprise a multiplexer having an output coupled to the downstream register cell and a plurality of inputs, each of said plurality of inputs being coupled to a different upstream register cell such that different length sections of the shift register can be selectively bypassed, the shift register further comprising a set of parallel IO channels facilitating conversion between interleaved and de-interleaved data, each of said channels being coupled to a different one of said nodes, the number of parallel IO channels being smaller than the total number of register cells in the shift register.

2. The shift register of claim 1, wherein the parallel IO channels comprise a set of parallel outputs coupled to the nodes between the N most downstream register cells, N being a positive integer having a value of at least 1.

3. The shift register of claim 1, wherein the parallel IO channels comprise a set of parallel inputs coupled to the nodes between the N most upstream register cells, N being a positive integer having a value of at least 1.

4. The shift register of claim 1, wherein the plurality of inputs of the multiplexer are coupled to the outputs of respective register cells such for each input, $2^{(M-1)}-1$ register cells are bypassed, with M being the input number of an input from said plurality of inputs, M being at least 1.

5. The shift register of claim 1, wherein the number of multiplexer inputs matches the sum of (de-)interlacing degrees to be processed by the shift register.

6. The shift register of claim 1, wherein the at least some of said nodes further comprise a further multiplexer having a first input coupled to the output of the multiplexer, a second input for receiving load data and an output coupled to the downstream register cell.

7. An electronic device comprising the shift register of claim 1 and a controller for selecting an input of said respective multiplexers.

8. The electronic device of claim 7, wherein the parallel IO channels comprise a set of parallel outputs coupled to the nodes between the N most downstream register cells, N being a positive integer having a value of at least 1, and wherein the controller is configured to de-interleave the parallel data in the shift register into serial data streams on said output and respective parallel outputs.

9. The electronic device of claim 7, wherein the parallel IO channels comprise a set of parallel inputs coupled to the nodes between the N most upstream register cells, N being a positive integer having a value of at least 1, and wherein the controller is configured to parallelize the serial input data in the shift register in an interleaved fashion.

10. The electronic device of claim 7, wherein the controller is a microcontroller.

11. A method of controlling the shift register of claim 1, comprising the steps of:
in a serial shift mode of said shift register, selecting one of the inputs of said multiplexers such that data received on said inputs has bypassed a predefined number of register cells; and
in a parallel communication mode, communicating data with said selection of said register cells in parallel over said parallel IO channels.

12. The method of claim 11, wherein the parallel IO channels comprise a set of parallel outputs coupled to the nodes between the N most downstream register cells, N being a positive integer having a value of at least 1, and wherein said data communication step comprises de-interleaving the parallel data in the shift register into serial data streams on the output and said respective parallel outputs.

13. The method of claim 11, wherein the parallel IO channels comprise a set of parallel inputs coupled to the nodes between the N most upstream register cells, N being a positive integer having a value of at least 1, and wherein said data communication step comprises parallelizing the serial input data in the shift register in an interleaved fashion.

14. A non-transitory computer-readable medium containing program instructions to implement the method of claim 11.

* * * * *